United States Patent
Korta et al.

(10) Patent No.: US 11,076,503 B2
(45) Date of Patent: Jul. 27, 2021

(54) THERMALLY CONDUCTIVE INSERT ELEMENT FOR ELECTRONIC UNIT

(71) Applicant: APTIV TECHNOLOGIES LIMITED, St. Michael (BB)

(72) Inventors: Jakub Korta, Cracow (PL); Marcel Fruend, Remscheid (DE); Klaus Kaufmann, Wuppertal (DE)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

(21) Appl. No.: 16/747,097

(22) Filed: Jan. 20, 2020

(65) Prior Publication Data

US 2020/0236811 A1 Jul. 23, 2020

(30) Foreign Application Priority Data

Jan. 21, 2019 (EP) .................................... 19152913

(51) Int. Cl.
| | |
|---|---|
| H05K 7/20 | (2006.01) |
| H01L 23/473 | (2006.01) |
| H01L 23/367 | (2006.01) |
| H05K 5/06 | (2006.01) |
| H01L 23/433 | (2006.01) |

(52) U.S. Cl.
CPC ..... *H05K 7/20418* (2013.01); *H01L 23/3675* (2013.01); *H01L 23/433* (2013.01); *H01L 23/473* (2013.01); *H05K 5/069* (2013.01); *H05K 7/20254* (2013.01); *H05K 7/20445* (2013.01)

(58) Field of Classification Search
CPC ............ H01L 23/3675; H01L 23/4332; H05K 7/20254; H05K 7/20509
See application file for complete search history.

(56) References Cited

U.S. PATENT DOCUMENTS

| | | | | |
|---|---|---|---|---|
| 2,780,757 A | * | 2/1957 | Thornhill | H01L 23/473 257/708 |
| 4,138,692 A | * | 2/1979 | Meeker | H01L 23/4332 165/80.4 |
| 6,648,062 B2 | * | 11/2003 | Fukazu | F28F 3/04 165/185 |
| 6,809,932 B2 | * | 10/2004 | Wu | H05K 9/0024 165/185 |

(Continued)

FOREIGN PATENT DOCUMENTS

| | | |
|---|---|---|
| DE | 102016106180 A1 | 10/2017 |
| EP | 2916636 A1 | 9/2015 |
| JP | 11163572 A * | 6/1999 |

OTHER PUBLICATIONS

Extended European Search Report for Application No. EP 19 15 2913 dated Jul. 10, 2019.

*Primary Examiner* — Robert J Hoffberg
(74) *Attorney, Agent, or Firm* — Carlson, Gaskey & Olds

(57) ABSTRACT

Electronic unit comprises an housing comprising a top cover; a printed circuit board mounted inside the housing and comprising at least a first heating source element on the top layer of the printed circuit board; the top cover comprises at least a first opening; the electronic unit comprises at least a first thermally conductive insert element distinct from the housing and extending from its top extremity arranged around the first opening, to its bottom extremity in thermal contact with the first heating source element such that heating dissipation of the first heating source element is allowed; fixing means configured to entirely fix the top extremity of the first thermally conductive insert element with the top cover around the first opening.

15 Claims, 5 Drawing Sheets

(56) References Cited

U.S. PATENT DOCUMENTS

| | | | | |
|---|---|---|---|---|
| 6,881,077 B2* | 4/2005 | Throum | ............... | H05K 5/0052 |
| | | | | 439/76.1 |
| 7,050,305 B2* | 5/2006 | Thorum | ............... | H05K 5/0052 |
| | | | | 361/719 |
| 7,180,745 B2* | 2/2007 | Mandel | ............... | H01L 21/4878 |
| | | | | 361/719 |
| 7,352,585 B2* | 4/2008 | Mandel | ............... | H01L 21/4878 |
| | | | | 361/714 |
| 8,159,823 B2* | 4/2012 | Murakami | ................ | F28F 3/12 |
| | | | | 361/716 |
| 8,254,128 B2* | 8/2012 | Yasui | ................... | H01L 23/433 |
| | | | | 361/711 |
| 8,339,785 B2* | 12/2012 | Chang | ................ | H05K 7/20927 |
| | | | | 361/699 |
| 8,342,276 B2* | 1/2013 | Murakami | ............... | B60L 58/40 |
| | | | | 180/65.31 |
| 8,379,390 B2* | 2/2013 | Inoue | ..................... | H01L 24/32 |
| | | | | 361/713 |
| 9,392,317 B2* | 7/2016 | Bose | ................... | H04N 21/418 |
| 9,485,884 B2* | 11/2016 | Bose | ................... | H05K 7/2049 |
| 9,510,438 B2* | 11/2016 | Wakana | ............... | H05K 7/2039 |
| 9,578,783 B2* | 2/2017 | Ritter | ................... | H01L 23/4006 |
| 9,986,665 B2* | 5/2018 | Kosaka | ................ | H02M 7/537 |
| 2006/0139887 A1* | 6/2006 | Kameda | ............... | H01L 23/4332 |
| | | | | 361/704 |
| 2013/0329367 A1* | 12/2013 | Huang | ............... | H05K 7/20445 |
| | | | | 361/704 |
| 2015/0216074 A1* | 7/2015 | Nishihara | ............. | H01L 23/367 |
| | | | | 361/704 |
| 2017/0038154 A1* | 2/2017 | Wang | ................... | H01L 23/427 |

* cited by examiner

THERMALLY CONDUCTIVE INSERT ELEMENT FOR ELECTRONIC UNIT

CROSS REFERENCE TO RELATED APPLICATIONS

This application claims priority to European Patent Application No. 19152913.0, filed on Jan. 21, 2019.

TECHNICAL FIELD OF THE INVENTION

The invention relates to an electronic unit arranged with a thermally conductive insert element for optimized heat dissipation from a printed circuit board of the electronic unit.

BACKGROUND OF THE INVENTION

Typical enclosures for automotive electronics unit are designed for protecting fragile devices from unwanted mechanical loads, dust and humidity. For high efficiency and high power devices which generate significant amounts of thermal energy, a housing is also used to enable heat removal allowing the devices to operate within safe temperature limits.

Generally, in case of a die casted housing, heat dissipation is frequently obtained through conduction via the so-called pedestals, which are housing geometrical features allowing for establishing thermal joints between heat sources and housing walls. In case of high heat fluxes generate by electronic devices, complex structures, such as water cooling systems, are implemented in addition with the heat conduction obtained with the die casted housing.

It is therefore important to propose a new solution to solve these problems.

SUMMARY OF THE INVENTION

According to embodiments of the invention, an electronic unit comprises a housing comprising a top cover, a printed circuit board mounted inside the housing and at least a first heating source element arranged on the top layer of the printed circuit board. The top cover comprises at least a first opening and the electronic unit comprises at least a first thermally conductive insert element distinct from the housing and extending from its top extremity arranged around the first opening, to its bottom extremity in thermal contact with the first heating source element such that heating dissipation of the first heating source element is allowed, such that increased heat dissipation through conduction from the heat source element is possible. The electronic unit comprises fixing means configured to entirely fix the top extremity of the first thermally conductive insert element with the top cover around the first opening.

The first thermal conductive insert element may comprise a blind cavity extending from its opened top extremity entirely fixed around the first opening, to its bottom wall extremity in thermal contact with the first heating source element. The first thermally conductive insert element may have a thermal conductivity greater than the top cover. The fixing means may be watertight fixing means around the first opening.

The top extremity of the first thermally conductive insert element may comprise a flange arranged around the top extremity and fixed with the top cover around the first opening. The top cover may comprise a thickness reduction area all around the first opening corresponding to the thickness of the flange, the flange being arranged onto the reduced thickness area such that the surface area of the top cover comprising the flange is a flat surface. The thickness reduction may also be greater than the thickness of the flange such that the flange does not protrude above the top cover.

The top cover may be made of a liquid coolant cold plate, the top cover comprising a coolant liquid inlet, a coolant liquid outlet, and liquid coolant wall guides configured to convey the coolant liquid from the coolant liquid inlet to the first thermally conductive insert element and from the first thermally conductive insert element to the coolant liquid outlet.

The housing may comprise a top wall having an opening; the top cover being arranged onto the top wall; the first thermally conductive insert element being arranged through the opening in the top wall. The top wall may be made of plastic material. The first thermally conductive insert element and the top cover may be made of metallic material, preferably, the first thermally conductive insert element may be made of cooper alloy material and the top cover may be made of an aluminum alloy material. The fixing means may comprise a brazed joint or the fixing means may comprise an adhesive paste joint especially when the housing is not made of metallic material.

The printed circuit board may comprise a second heating source element on the top layer of the printed circuit board. The top cover may comprise a second opening such that the electronic unit may comprise a second thermally conductive insert element distinct from the housing and extending from its top extremity arranged around the second opening, to its bottom extremity in thermal contact with the second heating source element such that heating dissipation of the second heating source element is allowed. The second thermally conductive insert element may comprise a thermal conductivity different than the first thermally conductive insert element. The second thermally conductive insert element may be made of silver material.

BRIEF DESCRIPTION OF THE DRAWING

Other features, objects and advantages of the invention will become apparent from reading the detailed description that follows, and the attached drawing, given by way of example and in which.

DETAILED DESCRIPTION

Figure 1:
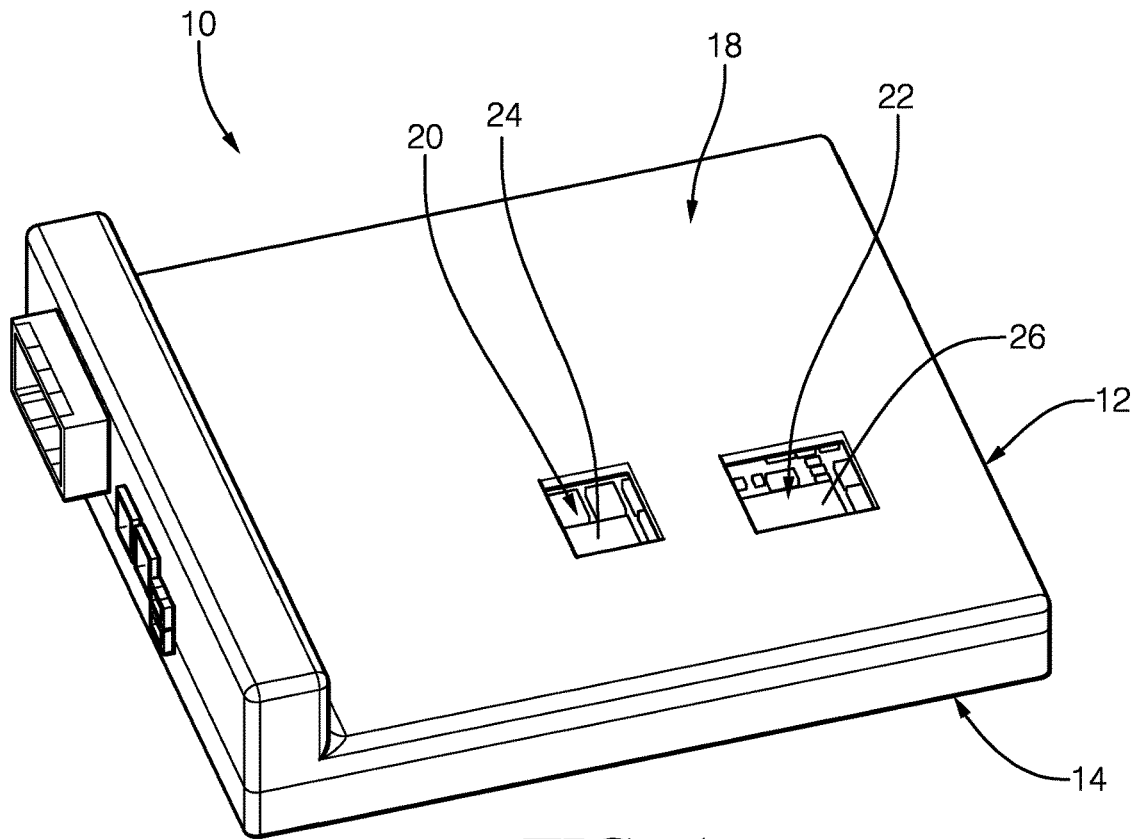
FIG. 1 is a schematic perspective view of the electronic unit without the thermally conductive insert elements according to one embodiment of the invention.

According to FIG. 1, an electronic unit 10 is shown. The electronic unit 10 may be an electronic control unit for a car or any kind of electronic unit 10, said electronic unit 10 comprises a housing 12. The housing 12 comprises a bottom wall 14 on which a printed circuit board 16 is arranged and a top wall or a top cover 18 that comprises a first opening 20 and a second opening 22 or a first cut-out and a second cut-out. The first opening 20 and the second opening 22 are opened square shape and are respectively arranged above a first heating source element 24 and a second heating source element 26, both heating source elements 24, 26 being arranged on the top layer of the printed circuit board 16.

A heating source element 24, 26 in the sense of the present disclosure relates to an electronic component that may generate heat during operation, or to any conductive layout pattern as a copper track pattern, that also may generate heat when a current is flowing through said pattern.

Figure 2:
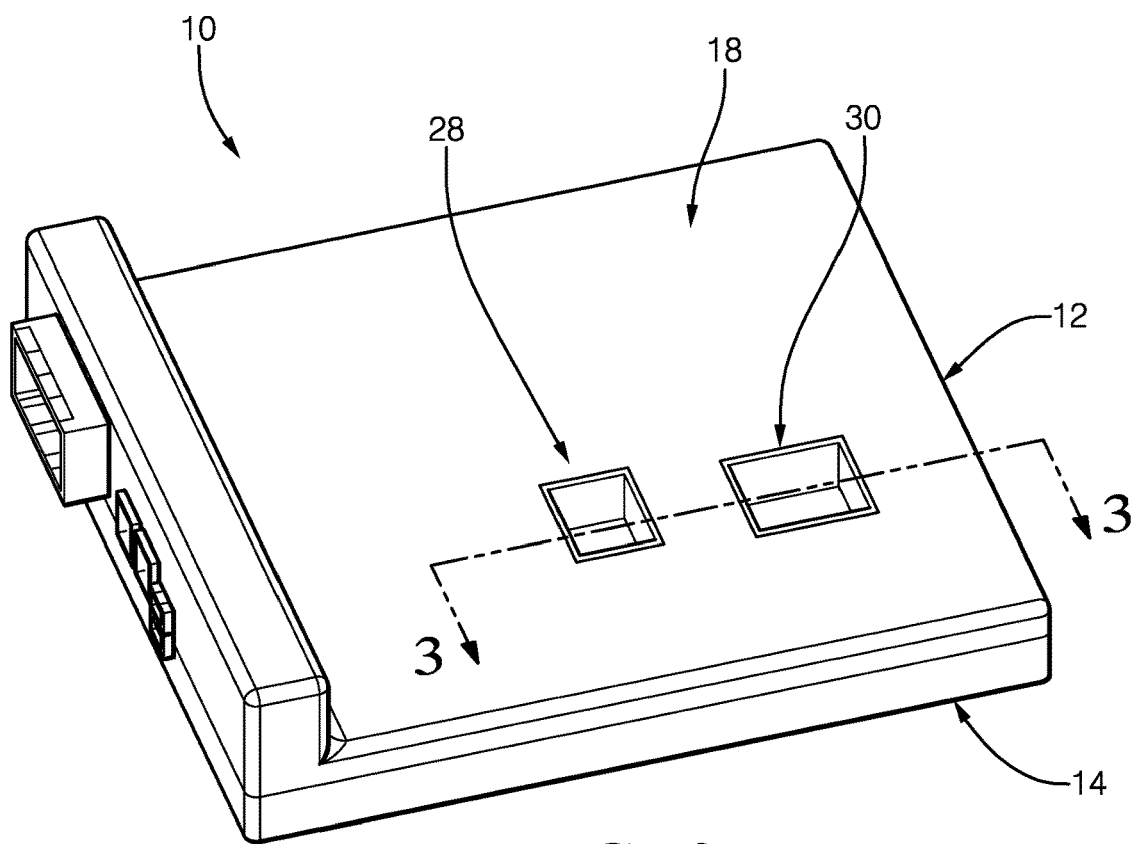
FIG. 2 is a schematic perspective view of the electronic unit of FIG. 1 arranged with the thermally conductive insert elements according to the invention.
Figure 3:
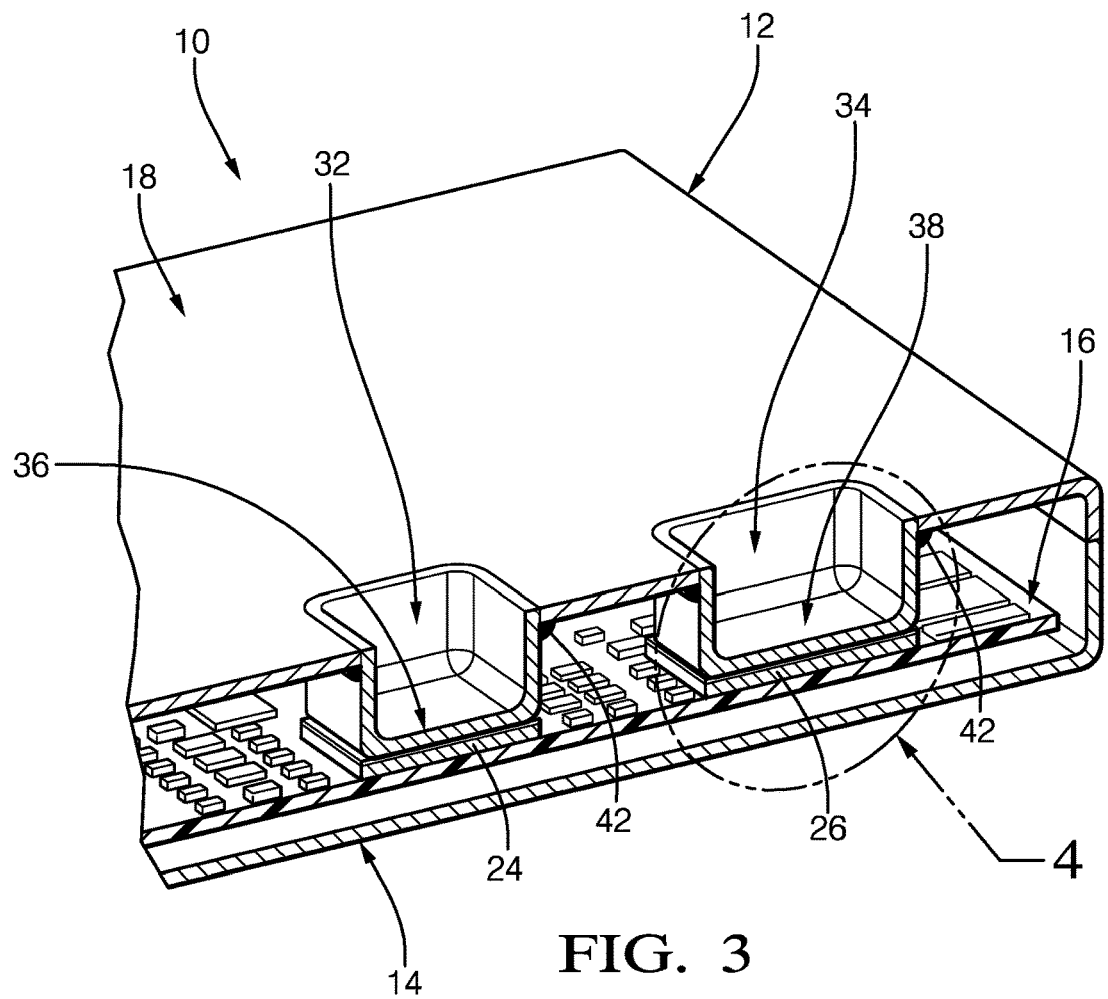
FIG. 3 is an axial cut view according to plan 3-3 of FIG. 2.

According to FIG. 2 and FIG. 3 the electronic unit 10 comprises a first thermally conductive insert element 28, or thermally conductive pedestal, and a second thermally conductive insert element 30. Both thermally conductive insert elements are distinct from the housing 12. The first thermally conductive insert element 28 and the second thermally conductive element 30 cooperate mechanically respectively with the first opening 20 and the second opening 22 of the top cover 18, and respectively with the first heating source element 24 and the second heating source element 26 such that heating dissipation of the first heating source element 24 and the heating dissipation of the second heating source element 26 are allowed.

As each thermally conductive insert element 28, 30 is distinct from the housing 12, they may have thermal conductivity different than the housing 12. Generally, the present description provides the advantage of using standard housing 12 material such as plastic or aluminum while the thermally conductive insert elements 28, 30 comprise greater thermal conductivity than the housing 12. Both thermally conductive insert elements 28, 30 may have the same thermal conductivity or different thermal conductivity. As a non-limiting example, both thermally conductive insert elements 28, 30 may be made of copper alloy, or if one of the two heating source element 24, 26 needs better heat dissipation, the thermally conductive insert element 28 relative to said heating source element 24 may be made of silver.

According to the embodiment shown in FIG. 2 and FIG. 3, each thermally conductive insert element 28, 30 comprises a blind cavity 32, 34 or a blind hole extending from its opened top extremity entirely fixed around its associated opening 20, 22, to its bottom wall extremity 36, 38 in thermal contact with the associated heating source element 24, 26.

Figure 4:
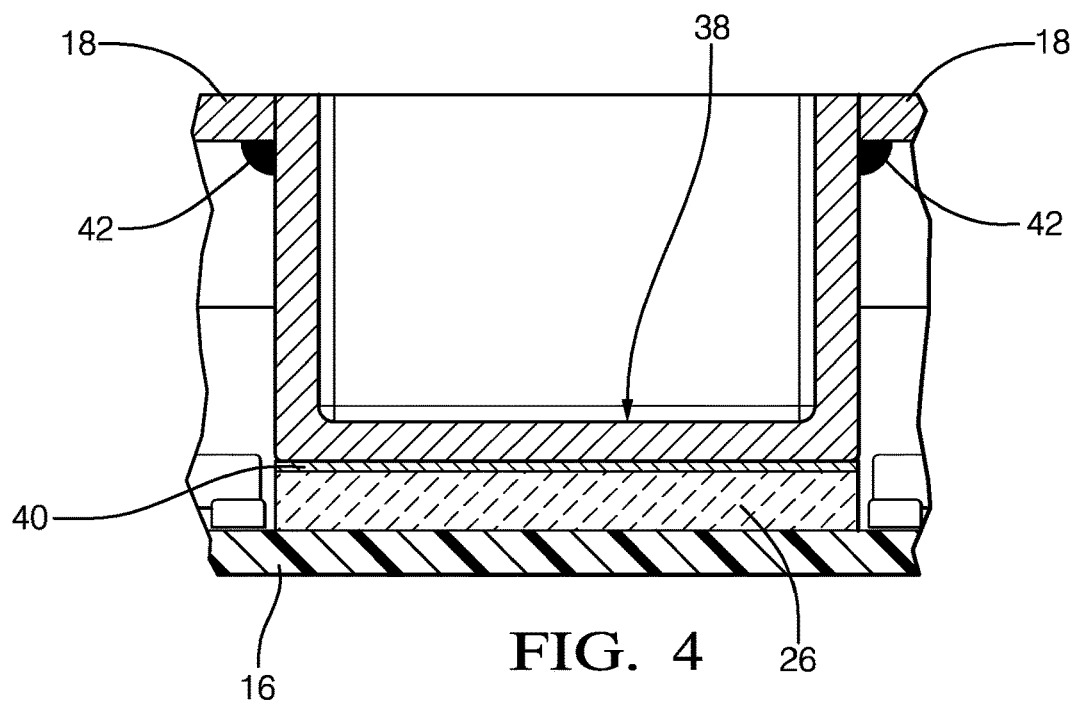
FIG. 4 is zoom view of the circled area 4 of FIG. 3.

According to FIG. 4, one embodiment of the arrangement of the second thermally conductive insert element 30 is shown. The arrangement of the first thermally conductive insert element 28 may be similar.

The top layer of the printed circuit board 16 comprises one electronic component as the second heating source element 26. Said electronic component may be as a non-limiting example, a microcontroller or a solid state power switch. The bottom wall extremity 38 of the second thermally conductive insert element 30 is in thermal contact with the second heating source element 26. More particularly, the second heating source element 26 is in thermal contact with the second thermally conductive insert element 30 by means of a thermal interface material 40 as thermal paste arranged on the top surface of the second heating source element 26. Alternatively, the bottom wall extremity 38 of the second thermally conductive insert element 30 may be in direct thermal contact with the top surface of the second heating source element 26, i.e. without thermal interface material such that heat transfer is less optimized.

The opened top extremity of the second thermally conductive insert element 30 is arranged inside the second opening 22 and comprises fixing means 42 cooperating with the perimeter inside of the second opening 22 of the top cover 18 such that a watertight seal is guaranteed between the second thermally conductive insert element 30 and the top cover 18. In other words, globally, the fixing means 42 are configured to entirely fix the top extremity of a thermally conductive insert element 28, 30 with the top cover 18 around an opening 20, 22 of the top cover 18.

Generally, the fixing means 42 comprise an adhesive paste joint that suits with most of the housing 12 materials that have to be fixed with the thermally conductive insert element 28, 30.

In case the top cover 18 is made of metallic material, and the first thermally conductive insert element 28 and the second thermally conductive insert element 30 are also made of metallic material, said first and second thermally conductive insert elements 28, 30 may be respectively brazed with the perimeter inside of the first opening 20 and the second opening 22 of the top cover 18 such that a brazed join is formed between each thermally conductive insert element 28, 30 and the top cover 18 providing a watertight sealing effect. As alternatives, the opened top extremity of the thermally conductive insert may be brazed with the perimeter of the opening on top of the top cover 18 or on the bottom side of the top cover 18.

Figure 5:
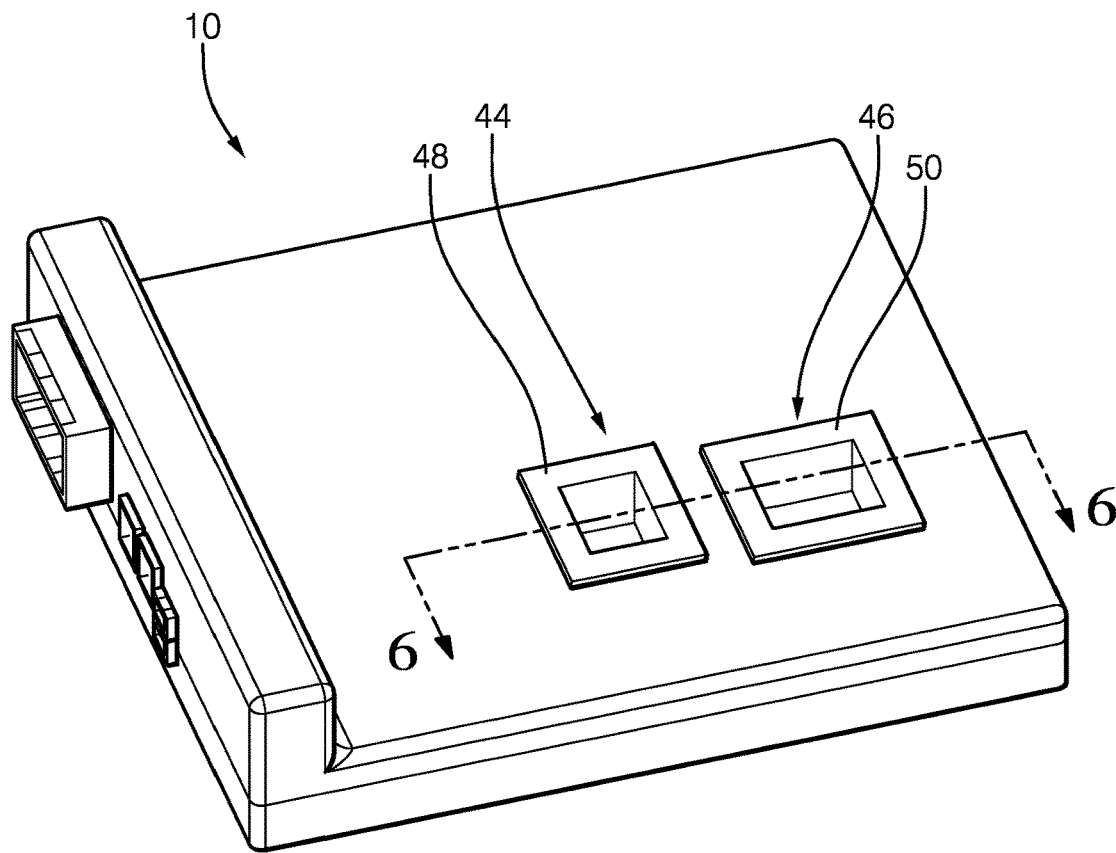
FIG. 5 is a schematic perspective view of the electronic unit with thermally conductive insert elements according to another embodiment of the invention.

According to FIG. 5, the top cover 18 of the electronic unit 10 comprises a variant of the first thermally conductive insert element 28 and the second thermally conductive insert element 30. The top cover 18 is equipped with a third thermally conductive insert element 44 and a fourth thermally conductive insert element 46 that differ from the first thermally conductive insert element 28 and the second thermally conductive insert element 30 by comprising a flange 48, 50 around their top extremity. The flange 48, 50 of each thermally conductive insert element 44, 46 improves the fixing strength of the third thermally conductive insert element 44 and of the fourth thermally conductive insert element 46 with the top cover 18. Additionally, in case of a metallic top cover 18, said flanges 48, 50 improve respectively the heating transfer from the third thermally conductive insert element 44 and from the fourth thermally conductive insert element 46 to the metallic top cover 18.

Figure 6:
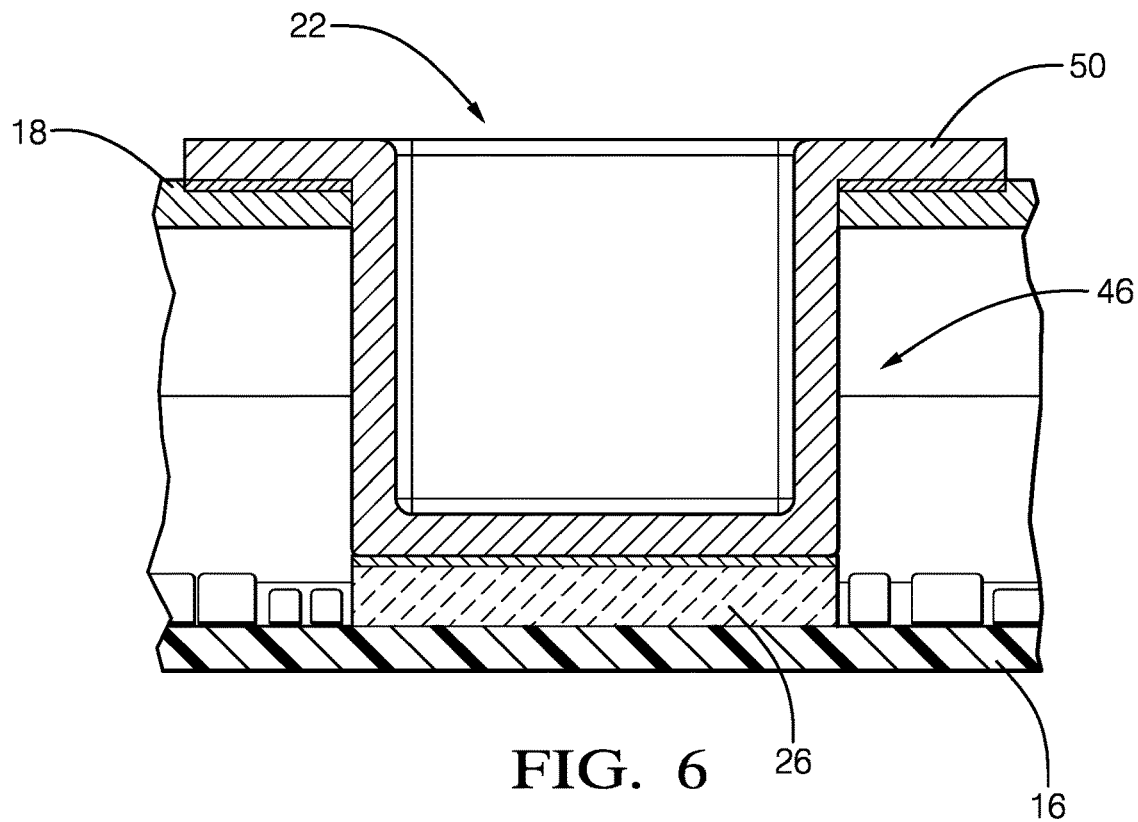
FIG. 6 is an axial cut view of one thermally conductive insert element according to plan 6-6 of FIG. 2.

According to FIG. 5 and FIG. 6, the flange 50 is fixed around the second opening 22 of the top cover 18, on the top surface, or external surface, of the top cover 18. Alternatively, the flange 50 may be fixed on the bottom surface, or internal surface, of the top cover 18. The flange 50 may be glued to the top cover 18 by an adhesive paste joint. In embodiments including a metallic top cover 18, the flange 50 may be brazed with the top cover 18 such that a brazed joint is formed between the flange 50 and the top cover 18.

Figure 7:
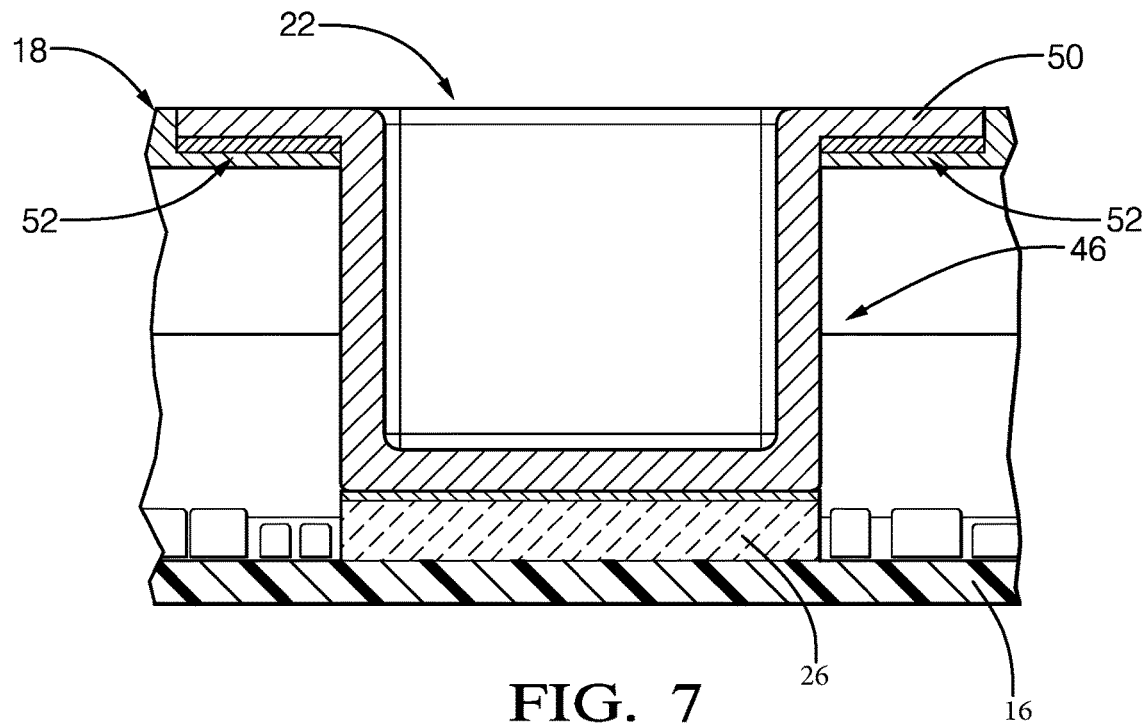
FIG. 7 is an alternative embodiment of FIG. 6.

According to FIG. 7, the top cover 18 is arranged with the fourth thermally conductive insert element 46. The flange 50 is mounted around the second opening 22, on the top surface of the top cover 18. More particularly, the top cover 18 comprises a thickness reduction area 52 all around the first opening 20. The thickness reduction is equal or greater than the thickness of the flange 50 such that the flange 50 does not protrude beyond the top surface of the top cover 18. While the thickness reduction is equal to the corresponding thickness of the flange 50, the surface area of the top cover 18 comprising the flange 50 is a flat surface.

The embodiment shown in FIG. 7 differs from the embodiment of FIG. 5 and FIG. 6 such that the top surface of the top cover 18 wherein the flange 50 is mounted, i.e. the thickness reduction area 52 of the top cover 18 comprising the flange 50, is a flat surface. In that case, the flange 50 of the fourth thermally conductive insert element 46 does not affect the top surface plan of the top cover 18.

Figure 8:
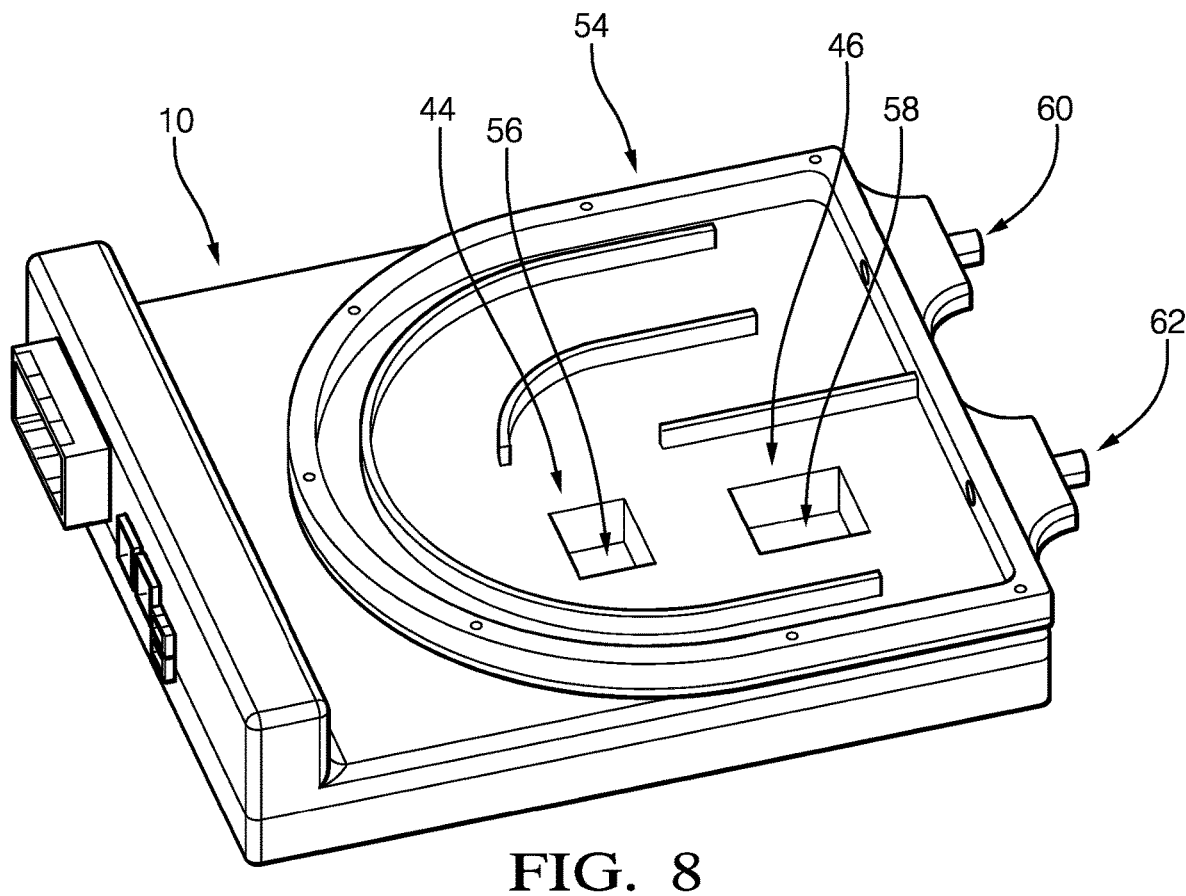
FIG. 8 is a schematic perspective view of the electronic unit arranged with a cold plate comprising thermally conductive insert elements according to another embodiment of the invention.

According to FIG. 8, the electronic unit 10 comprises a cold plate 54. The cold plate 54 is arranged on the top surface of the housing 12. According to FIG. 9 and FIG. 10, the mechanical cooperation between the cold plate 54 and the thermally conductive insert elements 44, 46 is similar to the mechanical cooperation between the top cover 18 and the third thermally conductive insert element 44 and the fourth thermally conductive insert element 46, as discussed above in connection with the embodiments shown in FIG. 5, FIG. 6 and FIG. 7. In other words, the cold plate 54 comprises two other openings 56, 58 such that the thermally conductive insert elements 44, 46 are fixed in a similar manner as discussed above in connection with the embodiments shown in FIGS. 5, 6 and 7.

Alternatively, the thermally conductive insert elements arranged with the cold plate 54 may be similar to the first thermally conductive insert element 28 and the second thermally conductive insert element 30 as shown in FIG. 2, FIG. 3 and FIG. 4.

Figure 9:
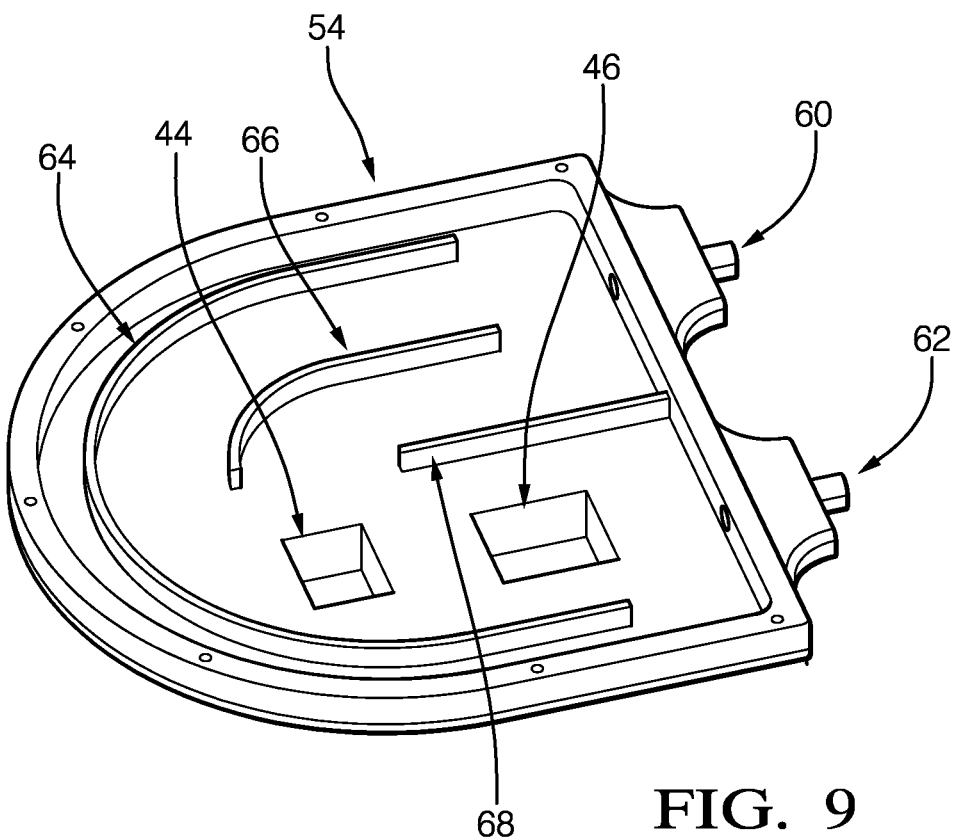
FIG. 9 is a top perspective view of the cold plate of FIG. 8.
Figure 10:
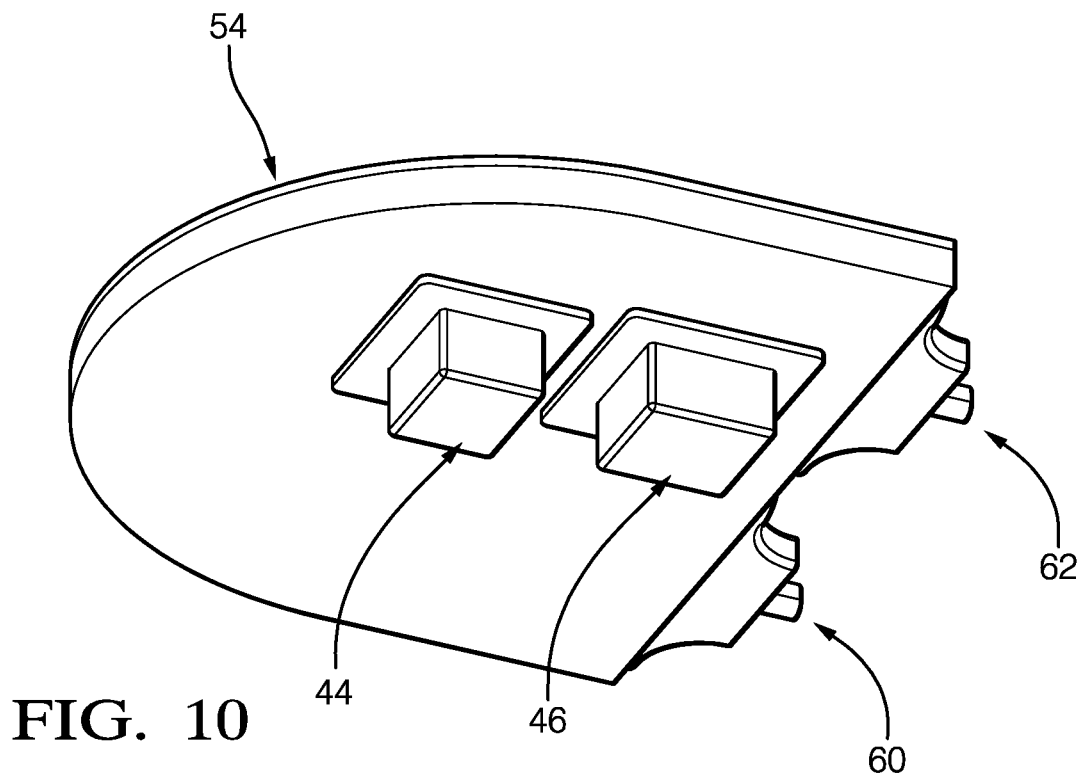
FIG. 10 is a bottom perspective view of the cold plate of FIG. 8.

According to FIG. 8, FIG. 9 and FIG. 10, as being fixed to the cold plate 54, when assembled with the electronic unit 10 housing 12, each thermally conductive insert element 44, 46 fixed with the cold plate 54 is arranged through an opening 20, 22 of the top wall of the housing 12 of the electronic unit 10, i.e. an opening 20, 22 of the top cover 18 as shown in FIG. 1. From that embodiment the thermally conductive insert elements 44, 46 are not any more primarily fixed with the housing 12, but they are primarily fixed with the cold plate 54. In order to guarantee a watertight seal between the cold plate 54 and the opening 20, 22 of the top wall of the housing 12, adhesive paste joint may be added between the cold plate 54 and the top wall of the housing 12.

According to FIG. 8, FIG. 9 and FIG. 10, the cold plate 54 is more particularly a liquid coolant cold plate 54 comprising a coolant liquid inlet 60 and a coolant liquid outlet 62.

More particularly, in order to efficiently cool down the thermally conductive insert elements 44, 46, the cold plate 54 comprises liquid coolant wall guides 64, 66, 68, as liquid coolant deflector, configured to convey the liquid coolant from the coolant liquid inlet 60 to each thermally conductive insert element 44, 46, and to convey the liquid coolant from each thermally conductive insert element 44, 46 to the coolant liquid outlet 62.

Alternatively, each thermally conductive insert element 44, 46 may be attached at their top extremity to a single cold plate to increase their thermal conductivity.

The invention is not limited to the shape of the openings 20, 22 of the top wall and of the top cover and of the thermally conductive insert elements 28, 30, 44, 46 shown in FIGS. 2 and 5. Other shapes may be also suitable for embodiments of the invention. In addition, thermal conductive materials other than the ones cited in that present description may also be suitable for the thermally conductive insert elements 28, 30, 44, 46. The number of thermally conductive insert elements 28, 30, 44, 46 and their corresponding heating source element 24, 26 may be greater than two.

The invention claimed is:

1. An electronic unit, comprising:
   a housing including a metal cover that has an opening through the metal cover;
   a printed circuit board mounted inside the housing;
   a heating source element supported on the printed circuit board within the housing; and
   a thermally conductive insert element distinct from the housing, the thermally conductive insert element comprising a metal, the thermally conductive insert element having a first end secured to the metal cover by a brazed joint, the first end of the thermally conductive insert element surrounding the opening through the metal cover, the thermally conductive insert element having a second end comprising a plate that is in thermally conductive contact with the heating source element, the thermally conductive insert element having at least one rigid sidewall extending between the first end and the second end that defines a fixed distance between the first end and the second end, the at least one rigid sidewall and one side of the plate defining a blind hole within the thermally conductive insert element between the first end and the second end.

2. The electronic unit of claim 1, wherein
   the thermally conductive insert element has a first thermal conductivity,
   the metal cover of the housing has a second thermal conductivity, and
   the first thermal conductivity is greater than the second thermal conductivity.

3. The electronic unit of claim 1, wherein the brazed joint establishes a watertight seal along an interface between the first end of the thermally conductive insert element and the metal cover.

4. The electronic unit of claim 1, wherein the first end of the thermally conductive insert element comprises a flange that is secured to the metal cover around the opening.

5. The electronic unit of claim 4, wherein
   the metal cover includes a recess surrounding the opening through the metal cover,
   the flange is received in the recess,
   the flange has a thickness, and
   the recess has a depth that is equal to or greater than the thickness of the flange.

6. The electronic unit of claim 1, wherein the thermally conductive insert element comprises a copper alloy material and the metal cover comprises an aluminum alloy material.

7. The electronic unit of claim 1, comprising:
   a second heating source element supported by the printed circuit board within the housing; and
   a second thermally conductive insert element distinct from the housing, the second thermally conductive insert element comprising a metal, the second thermally conductive insert element having a first end secured to the metal cover by a second brazed joint, the first end of the second thermally conductive insert element surrounding a second opening through the metal cover, the second thermally conductive insert element having a second end comprising a second plate that is in thermally conductive contact with the second heating source element, the second thermally conductive insert element having at least one second rigid sidewall extending between the first end and the second end that defines a fixed distance between the first end and the second end of the second thermally conductive insert element, the at least one second rigid sidewall and one side of the second plate defining a blind hole within the second thermally conductive insert element between the first end and the second end of the second thermally conductive insert element.

8. The electronic unit of claim 7, wherein
the thermally conductive insert element has a first thermal conductivity,
the second thermally conductive insert element has a second thermal conductivity, and
the first thermal conductivity is different than the second thermal conductivity.

9. The electronic unit of claim 8, wherein
the thermally conductive insert element comprises copper, and
the second thermally conductive insert element comprises silver.

10. An electronic unit, comprising:
a housing including a cover that has an opening through the cover;
a liquid cooling plate received adjacent the cover, the liquid cooling plate including an opening through the liquid cooling plate aligned with the opening through the cover;
a printed circuit board mounted inside the housing;
a heating source element supported on the printed circuit board within the housing; and
a thermally conductive insert element distinct from the housing, the thermally conductive insert element comprising a metal, the thermally conductive insert element having a first end secured to the liquid cooling plate cover, the first end of the thermally conductive insert element surrounding the opening through the liquid cooling plate, the thermally conductive insert element being at least partially received through the opening in the cover, the thermally conductive insert element having a second end comprising a plate that is in thermally conductive contact with the heating source element, the thermally conductive insert element having at least one rigid sidewall extending between the first end and the second end that defines a fixed distance between the first end and the second end, the at least one rigid sidewall and one side of the plate defining a blind hole within the thermally conductive insert element between the first end and the second end.

11. The electronic unit of claim 10, wherein
the liquid cooling plate comprises metal,
the first end of the thermally conductive insert element is secured to the liquid cooling plate by a brazed joint, and the brazed joint establishes a watertight seal along an interface between the first end of the thermally conductive insert element and the liquid cooling plate surrounding the opening through the liquid cooling plate.

12. The electronic unit of claim 10, wherein the liquid coolant plate comprises a coolant liquid inlet, a coolant liquid outlet, and liquid coolant wall guides configured to convey liquid coolant from the coolant liquid inlet toward the thermally conductive insert element and from the thermally conductive insert element toward the coolant liquid outlet.

13. The electronic unit of claim 10, comprising:
a second heating source element supported by the printed circuit board within the housing; and
a second thermally conductive insert element distinct from the housing, the second thermally conductive insert element comprising a metal, the second thermally conductive insert element having a first end secured to the liquid cooling plate, the first end of the second thermally conductive insert element surrounding a second opening through the liquid cooling plate, the second thermally conductive insert element having a second end comprising a second plate that is in thermally conductive contact with the second heating source element, the second thermally conductive insert element having at least one second rigid sidewall extending between the first end and the second end that defines a fixed distance between the first end and the second end of the second thermally conductive insert element, the at least one second rigid sidewall and one side of the second plate defining a blind hole within the second thermally conductive insert element between the first end and the second end of the second thermally conductive insert element.

14. The electronic unit of claim 13, wherein
the thermally conductive insert element has a first thermal conductivity,
the second thermally conductive insert element has a second thermal conductivity, and
the first thermal conductivity is different than the second thermal conductivity.

15. The electronic unit of claim 14, wherein
the thermally conductive insert element comprises copper, and
the second thermally conductive insert element comprises silver.

* * * * *